United States Patent [19]

Ishii

[11] Patent Number: 5,422,307
[45] Date of Patent: Jun. 6, 1995

[54] METHOD OF MAKING AN OHMIC ELECTRODE USING A TIW LAYER AND AN AU LAYER

[75] Inventor: Gaku Ishii, Yokohama, Japan

[73] Assignee: Sumitomo Electric Industries, Ltd., Osaka, Japan

[21] Appl. No.: 24,301

[22] Filed: Mar. 1, 1993

[30] Foreign Application Priority Data

| | | | |
|---|---|---|---|
| Mar. 3, 1992 | [JP] | Japan | 4-045751 |
| Mar. 13, 1992 | [JP] | Japan | 4-055408 |
| Mar. 18, 1992 | [JP] | Japan | 4-062299 |

[51] Int. Cl.$^6$ ............................................. H01L 29/46
[52] U.S. Cl. .............................. 437/184; 437/192; 437/246
[58] Field of Search ............... 437/184, 189, 192, 200, 437/246

[56] References Cited

U.S. PATENT DOCUMENTS

| | | | |
|---|---|---|---|
| 4,673,593 | 6/1987 | Himoto | 427/89 |
| 5,100,835 | 3/1992 | Zheng | 437/184 |
| 5,179,041 | 1/1993 | Yano et al | 437/184 |
| 5,240,877 | 8/1993 | Yoshida et al. | 437/184 |
| 5,250,466 | 10/1993 | Gerner et al. | 437/184 |

FOREIGN PATENT DOCUMENTS

| | | |
|---|---|---|
| 386775 | 9/1990 | European Pat. Off. . |
| 57-063837 | 4/1982 | Japan . |
| 58-135668 | 8/1983 | Japan . |
| 63-015436 | 1/1988 | Japan . |
| 2-058326 | 2/1990 | Japan . |
| 3-135017 | 6/1991 | Japan . |

OTHER PUBLICATIONS

Notomi et al., "A 45K Hemt Gate Array with 35PS DCFL and 50PS BDCFL Gates", 1991 IEEE Intl. Solid–State Circuits Conference Digest of Technical Papers, 1991, pp. 152–153.

*Primary Examiner*—Olik Chaudhuri
*Assistant Examiner*—Ken Horton
*Attorney, Agent, or Firm*—Beveridge, DeGrandi, Weilacher & Young

[57] ABSTRACT

A semiconductor device having a high productivity, a low resistance ohmic electrode, a high integration density, a low deterioration of a characteristic of each component and a high yield is provided. The ohmic contact of the semiconductor device has a structure of an AuGe/Ni alloy layer (27), a WSi layer (18c) and an Au layer (17d) sequentially laminated on a GaAs substrate (1). The flatness of the electrode is maintained by the WSi layer (18c) and the reduction of a resistance of the electrode is attained by the Au layer (17d).

10 Claims, 15 Drawing Sheets

METHOD OF MAKING AN OHMIC ELECTRODE USING A TIW LAYER AND AN AU LAYER

BACKGROUND OF THE INVENTION

1. Field of the Invention

The present invention relates to a III-V compound group semiconductor device, and more particularly to a III-V compound group semiconductor device characterized by a wiring, a resistance, and an ohmic electrode built into a field effect transistor (FET).

2. Related Background Art

An alloyed ohmic contact method has been known as one of methods for forming an ohmic contact of an FET on a semiconductor substrate. In this method, a metal as a base and a metal as dopant are deposited on the semiconductor substrate and they are alloyed by a thermal process to form the ohmic contact. Ag or In is used as the base electrode, Si, Ge or Sn frequently is used for an n-type dopant, and Zn, Be or Mg frequently is used for a p-type dopant. Among others, a two-layered ohmic contact having an AuGe layer formed on a GaAs substrate and having a Ni layer formed thereon is frequently used.

FIG. 1 shows an FET having an ohmic electrode structure formed by the prior art method. A pair of ohmic electrodes 4a and 4b for a source and a drain are formed on the opposite sides of a gate electrode 20 formed on an n-type GaAs substrate 1, and a pair of ohmic electrode wirings 60a and 60b are formed to cover the ohmic electrodes. The ohmic electrodes 4a and 4b are of the AuGe/Ni structure described above.

FIGS. 2A–2F and FIG. 3 show the AuGe/Ni two-layered ohmic electrode and a method for forming the same. The forming method is first explained. An interlayer insulation film 2 is vacuum-deposited on the GaAs substrate 1 (step 201 in FIG. 3, and FIG. 2A). A photoresist material is applied on the interlayer insulation film 2 to form a resist pattern 6 having an opening at an ohmic electrode formation area (step 202 in FIG. 3, and in FIG. 2B). Then, the interlayer insulation film 2 is partially etched to form an electrode pattern (step 203 in FIG. 3, and FIG. 2C). An AuGe layer 7 is vacuum-deposited on the GaAs substrate 1 having the electrode pattern formed thereon. An Ni layer 8 is further vacuum-deposited on the AuGe layer 7 (step 204 in FIG. 3, and FIG. 2D). Then, unnecessary metal is removed by a lift-off method (step 205 in FIG. 3, and FIG. 2E). The AuGe layer 7 and the Ni layer 8 formed in the above steps are heated to an alloying temperature to form an ohmic electrode made of AuGe/Ni alloy 3 (step 206 in FIG. 3, and FIG. 2F).

Besides the ohmic electrode formed by the above method, an ohmic electrode formed by a second prior art method is known. In this method, an AuGe/Au ohmic electrode is formed on the n-type GaAs substrate 1.

An ohmic electrode formed by a third prior art method is also known. In this method, a refractory metal alloy or silicide is sandwiched between an AuGe layer and an Au layer such as an AuGe/TiW/Au structure or an AuGe/WSi/Au structure on the n-type GaAs substrate 1. (See Japanese Laid-Open Patent Publication No. 58-135668).

In the prior art ohmic electrode, a resistance of the electrode can be reduced by applying Au to the surface thereof. However, in the ohmic electrode by the first prior art method described above, when the Au layer is formed directly on the Ni layer and heated to the alloying temperature, a so-called ball-up phenomenon may occur. The ball-up means a phenomenon in which irregular alloying proceeds. The flatness of the electrode is lost, and in a long range, Au reacts with GaAs to deteriorate the reliability. In order to prevent the ball-up, metal may be inserted between the Ni layer and the Au layer. The formation of the metal must be done by a sputtering method because it is difficult to raise the temperature to the melting point by the vacuum deposition method. However, when the sputtering method is used, the metal is also formed on the side wall of the aperture (ohmic electrode formation area) of the photoresist. This makes the removal of the metal by the lift-off method impossible. Accordingly, in the prior art electrode formation method, the Au thin film cannot be applied to the surface.

In the above ohmic electrode structure, a measure to reduce the resistance in a post process is required because the resistance of the ohmic electrode is raised. To this end, ohmic electrode wirings 60a and 60b cover the entire surfaces of the ohmic electrodes 4a and 4b as shown in FIG. 1. As a result, other wirings cannot be formed to cross the ohmic electrodes 4a and 4b, and this causes the reduction of an integration density of the semiconductor device.

In the ohmic electrode structure formed by the second prior art method, the resistance of the ohmic electrode is maintained low but the upper Au layer and the Ga of the substrate react and it raises a problem with respect to the reliability of the semiconductor device.

In the ohmic electrode structure formed by the third prior art method, the resistance of the ohmic electrode is maintained low but it is difficult to reduce the resistance of the ohmic contact area.

The wiring in the prior art semiconductor device is now discussed. The wiring by Au (Au wiring layer) is usually not provided directly on the underlying insulation film, but a Ti layer or a Ti/Pt structure layer (which is a lamination of a Ti layer and a Pt layer) is frequently formed between the Au wiring layer and the underlying insulation film. The Ti layer enhances the coupling of the underlying insulation film and the Au wiring layer, and the Pt layer functions as a barrier metal to prevent the mutual diffusion of Ti and Au. Accordingly, the Pt layer is provided on the Ti layer or it is not provided, depending on the application and the life of the semiconductor device.

The above structure is described in "1991 IEEE International Solid-State Circuits Conference DIGEST OF TECHNICAL PAPERS" p. 152–153, P. 308.

However, Au and Ti react at a temperature of higher than 300° C. to form an alloy layer having a high resistance. Accordingly, the Ti/Au wiring structure having the lamination of the Ti layer and the Au wiring layer has a short lifetime in view of the reliability of the semiconductor device. When a multi-layer wiring is formed by using a Ti/Pt/Au structure having a lamination of a Ti layer, a Pt layer and an Au layer, the Au (gold) 114 of a first layer wiring 110 and the Ti (titanium) 123 of a second layer wiring 120 contact in a through-hole 130 by which the first layer wiring 110 and the second layer wiring 120 are connected, as shown in FIG. 4. As a result, the mutual diffusion occurs in that area and the reliability is deteriorated.

The film resistance in the prior art semiconductor device is now discussed with reference to FIGS. 5A-5D.

FIGS. 5A-5D show steps of a prior art method for forming a high resistance film and a peripheral wiring on an insulation film on the surface of the substrate.

A resistor metal Ni-Cr-Si layer 222 is formed on an insulation film 221 deposited on the surface of the substrate. A photoresist 223 is applied on the Ni-Cr-Si layer 222, and it is patterned into a shape of a desired high resistance film (FIG. 5A). The Ni-Cr-Si layer 222 is etched by using the photoresist 223 as a mask, and an insulation film 224 is formed thereon (FIG. 5B). Contact holes 225 and 226 are formed in the insulation film 224 (FIG. 5C), and a metal wiring Au layer 227 is formed on the insulation film 224 and in the contact holes 225 and 226 (FIG. 5D). The Ni-Cr-Si layer 222 which is the high resistance film and the metal wiring Au layer 227 are electrically connected by the formation of the Au layer 227.

In the prior art manufacturing method described above, the resistance fluctuates because the dimension of the high resistance film is determined by the positions of the contact holes 225 and 226. Further, since margin for positioning between the high resistance film and the wiring is required, it is not suitable for high integration density.

SUMMARY OF THE INVENTION

It is a first object of the present invention to provide a method for forming an ohmic electrode which permits one to improve an integration density of a semiconductor device and reduce the deterioration of a characteristic of the components.

It is a second object of the present invention to provide a semiconductor device which has a high integration density by the use of the above ohmic electrode, has reduced deterioration of a characteristic of the components and has a high yield.

The semiconductor device of the present invention has an ohmic electrode having a gold germanium/nickel (AuGe/Ni) alloy layer which is an alloy of a gold germanium (AuGe) layer and a nickel (Ni) layer, a tungsten (W) alloy layer and a gold (Au) layer sequentially laminated on a GaAs substrate. A titanium tungsten (TiW) layer or a tungsten silicide (WSi) layer is used as the tungsten (W) alloy layer which forms the ohmic electrode.

The method for forming the ohmic electrode of the present invention comprises a first step of forming an interlayer insulation film on a GaAs substrate and selectively removing the interlayer insulation film in a ohmic electrode formation area, a second step of sequentially laminating a gold germanium (AuGe) layer, a nickel (Ni) layer, a tungsten (W) alloy layer and a gold (Au) layer on the interlayer insulation film and the exposed GaAs substrate, a third step of forming a mask pattern covering the ohmic electrode formation area on the gold (Au) layer and etching off those areas of the gold germanium (AuGe) layer, the nickel (Ni) layer, the tungsten (W) alloy layer and the gold (Au) layer which are not covered by the mask pattern, and a fourth step of removing the mask pattern and alloying the gold germanium (AuGe) layer and the nickel (Ni) layer to form a gold germanium/nickel (AuGe/Ni) alloy layer.

A titanium tungsten (TiW) layer or a tungsten silicate (WSi) layer is used as the tungsten (W) alloy layer in the above formation method.

The semiconductor device of the present invention has the ohmic electrode structure formed by laminating the AuGe/Ni layer, the tungsten (W) alloy layer and the Au layer on the GaAs substrate and alloying only the AuGe/Ni layer. Accordingly, the ohmic electrode structure formed in the semiconductor device has a sufficiently low contact resistance and a sufficiently low resistance in the ohmic electrode area. Accordingly, it is not necessary to increase the contact area of the ohmic electrode wiring, and hence the integration density of the semiconductor device can be increased and the deterioration of the characteristic of the components is prevented.

In accordance with the present ohmic electrode, the ball-up phenomenon can be prevented by the W (tungsten) alloy layer formed on the AuGe/Ni alloy layer. The reduction of the resistance of the electrode is attained by the Au layer formed on the W (tungsten) alloy layer.

On the other hand, in the method for forming the ohmic electrode of the present invention, when the AuGe/Ni layer is alloyed to form the ohmic contact, the alloying proceeds only for GaAs/AuGe/Ni because the laminated tungsten (W) alloy layer serves as a barrier metal for the GaAs/AuGe/Ni layer and the Au layer.

When the interlayer insulation film is formed on the GaAs substrate prior to the above formation method, the interlayer insulation film prevents the damage to the GaAs substrate during the etching process of the metal layers. Since the lift-off method is not used in the lamination process of the metal layers, various deposition methods may be used. Accordingly, the W (tungsten) alloy layer and the Au layer may be formed by the sputtering method. Further, the W (tungsten) alloy layer formed on the AuGe/Ni alloy layer serves as the barrier to prevent the formation of an irregular alloy.

It is a third object of the present invention to provide a wiring structure of high reliability in a semiconductor device.

In order to achieve the above object, the wiring structure of the present invention in the semiconductor device which uses Au in the wiring layer, has a TiW layer between the wiring layer and an insulation film on which the wiring layer is formed. The TiW layer preferably has a Ti mass percentage of 5% to 30%.

In accordance with the present invention, since the TiW layer is formed between the underlying insulation film and the Au wiring layer, the coupling of the underlying insulation film and the Au wiring layer is secured by the TiW layer. When the Ti mass percentage in the TiW layer is 5% to 30%, the TiW layer and the Au wiring layer do not react up to 400° C. As a result, the low resistance of the Au wiring layer is maintained even in a high temperature atmosphere.

It is a fourth object of the present invention to provide a resistor and a peripheral wiring thereof which have a small variance in the resistance and are suitable for high density integration, and a method for forming the same.

In order to achieve the above object, a method for forming a resistor and a peripheral wiring thereof of the present invention comprises a step of sequentially laminating a resistor metal layer and a wiring metal layer on an insulation layer to form a multi-layer metal layer, a step of patterning the multi-layer metal layer into a desired pattern by a lithography technique, and a step of etching off a desired area of the wiring metal layer by the lithography technique.

In accordance with the method for manufacturing the resistor and the peripheral wiring thereof of the present invention, a desired wiring metal layer of the multi-layer metal layer patterned into the desired pattern is etched off. The area of the wiring metal layer which was etched off serves as the high resistance area, and the area of the wiring metal layer which was not etched off serves as the wiring. The resistance of the high resistance area thus formed is determined by the area and the shape of the etched-off wiring metal layer.

DETAILED DESCRIPTION OF THE PREFERRED EMBODIMENTS

Figure 1:
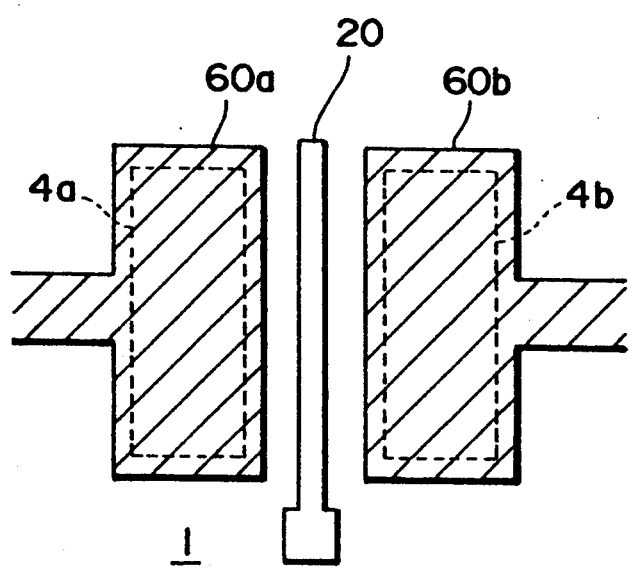
FIG. 1 shows a plan view of a prior art ohmic electrode.
Figure 2A:
FIGS. 2A to 2F show sectional views of steps of a prior art method for forming the ohmic electrode.
Figure 2B:
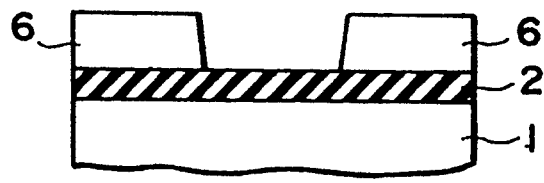
Figure 2C:
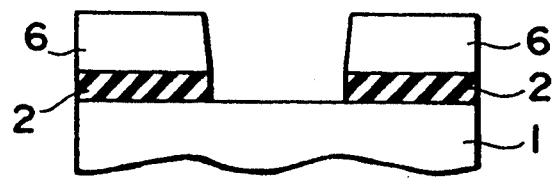
Figure 2D:
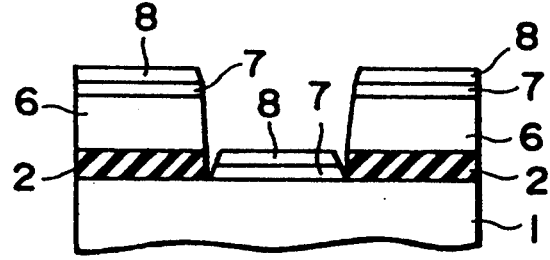
Figure 2E:
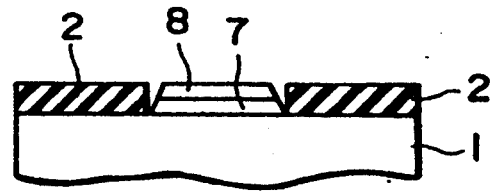
Figure 2F:
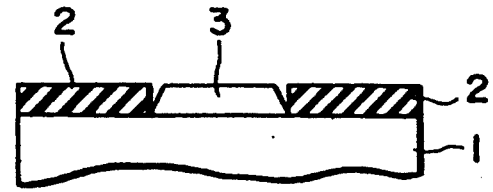
Figure 3:
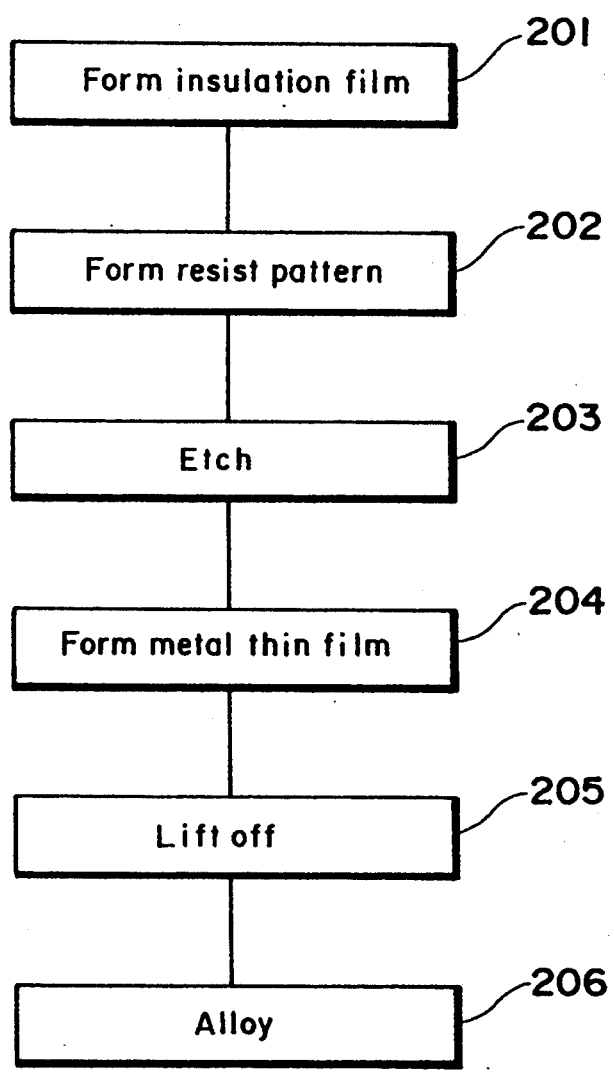
FIG. 3 shows a flow chart of the formation process.
Figure 4:
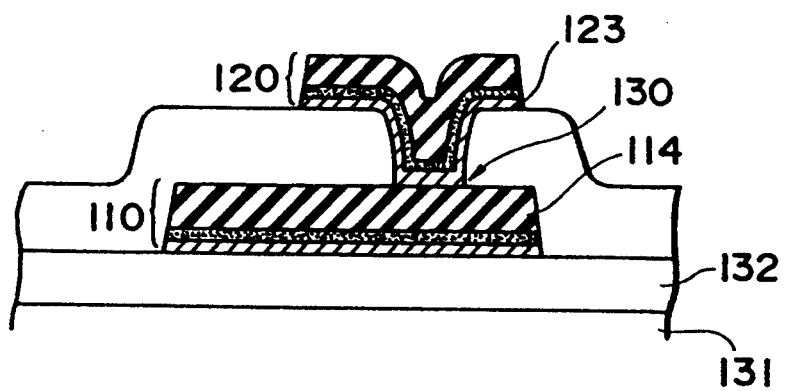
FIG. 4 shows a sectional view of a prior art wiring structure.
Figure 5A:
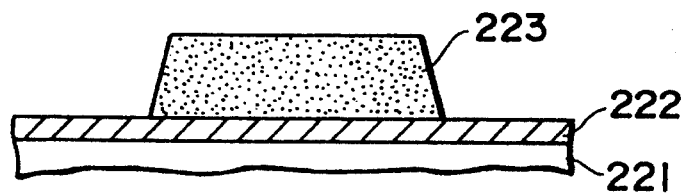
FIGS. 5A to 5D show sectional views of steps of a prior art method for manufacturing a resistor and a peripheral wiring thereof.
Figure 5B:
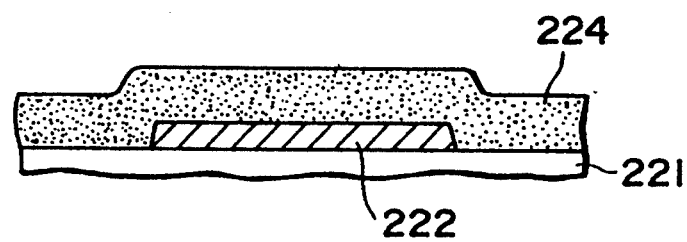
Figure 5C:
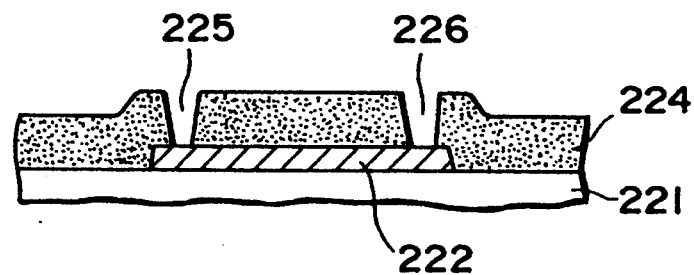
Figure 5D:
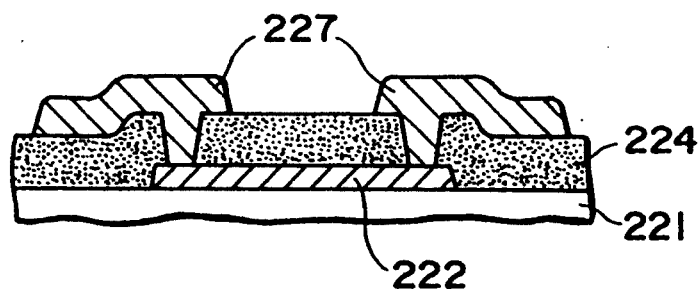
Figure 6:
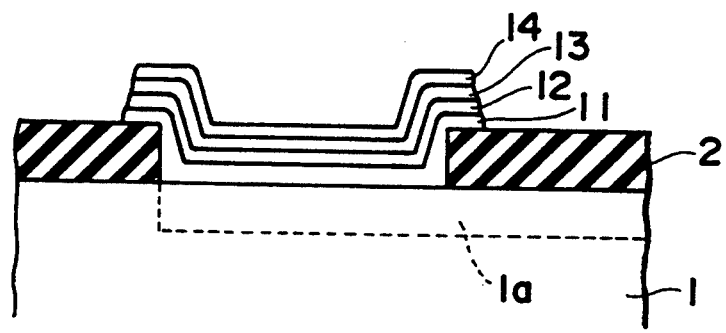
FIG. 6 shows a sectional view of an ohmic electrode structure before alloying in one embodiment of the present invention.

FIG. 6 illustrates an embodiment of an ohmic electrode structure of the present invention. It shows a sectional view before alloying. An n-type ion implantation region 1a is formed on a surface of a semi-insulative GaAs substrate 1. An SiN insulation film 2 is formed to cover the GaAs substrate 1 and metal layers 11-14 which are to form the ohmic electrode structure are deposited in an aperture thereof. The metal layers 11-14 consist of an AuGe layer 11, an Ni layer 12, a TiW layer 13 and an Au layer 14, from the bottom to the top. The AuGe layer 11 is preferably in a range of 800-1200 Angstrom in thickness. The Ni layer 12 is preferably in a range of 200-400 Angstrom in thickness. The TiW layer 13 is preferably in a range of 200-1000 Angstrom in thickness. The Au layer 14 is preferably in a range of 1000-3000 Angstrom in thickness.

The structure shown in FIG. 6 is heated in a furnace to alloy the ion implantation region 1a, the AuGe layer 11 and the Ni layer 12. Thus, the ohmic electrode structure is completed. Since the TiW layer 13 serves as a barrier metal, the diffusion of Au into the ion implantation region 1a or the diffusion of Ga and As into the Au layer 14 is prevented. In this manner, the reliability of the ohmic contact is enhanced. In addition, since the Au layer 14 is formed on a relatively low conductivity TiW layer 13, the resistance of the ohmic electrode can be reduced sufficiently.

Figure 7:
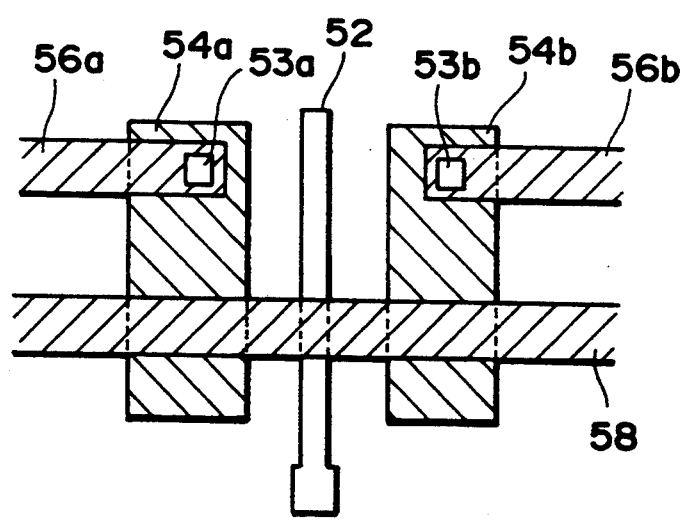
FIG. 7 shows a plan view of an FET having the ohmic electrode structure formed by the structure of FIG. 6, FIGS. 8A to 8H show sectional views of steps of a method for forming an ohmic electrode structure in an embodiment of the present invention.

FIG. 7 shows a plan view of an FET having the ohmic electrode structure formed by alloying the structure shown in FIG. 6. A pair of ohmic electrodes 54a and 54b for a source and a drain are formed on the opposite sides of a gate electrode 52 formed on the GaAs substrate. A pair of ohmic electrode wirings 56a and 56b are connected to the ohmic electrodes 54a and 54b through contact holes 53a and 53b. Since the ohmic electrodes 54a and 54b are formed by alloying the AuGe/Ni metal layers 11 and 12 of FIG. 6 and the top layer is the Au layer 14, the resistivity thereof is low. As a result, the characteristic of the FET can be fully maintained by a contact hole of 1 micron square without the need for enlarging the ohmic electrode wirings as required in the prior art. Accordingly, the wiring 58 which crosses the ohmic electrodes 54a and 54b may be formed so that the dimension of the integrated circuit of the semiconductor device can be significantly reduced and the characteristic of the integrated circuit or the semiconductor device can be improved.

In the above structure, a WSi layer may be used in place of the TiW layer to attain the same effect.

A method for forming the ohmic electrode of the present embodiment is now explained in detail.

FIGS. 8A-8H and FIG. 9 show sectional views and a flow chart of steps of the method for forming the ohmic electrode having the above structure. In the present embodiment, it is formed by a first step (FIGS. 8A-8D) for forming an interlayer insulation film having an opening in an ohmic electrode formation area, a second step (FIG. 8E) for sequentially forming the electrode metal layers, a third step (FIGS. 8F-8G) for removing undesired metals by etching, and a fourth step (FIG. 8H) for forming the alloy by a thermal process. The formation steps are now explained in detail.

Figure 8A:
Figure 8B:
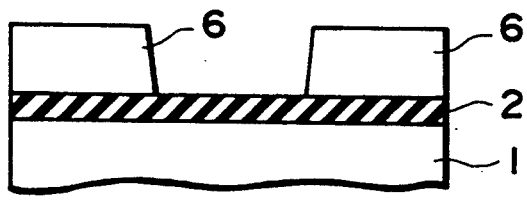
Figure 8C:
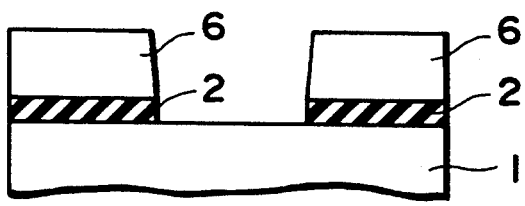
Figure 8D:
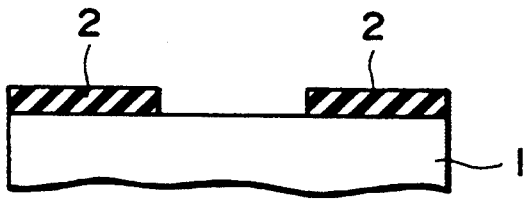
Figure 8E:
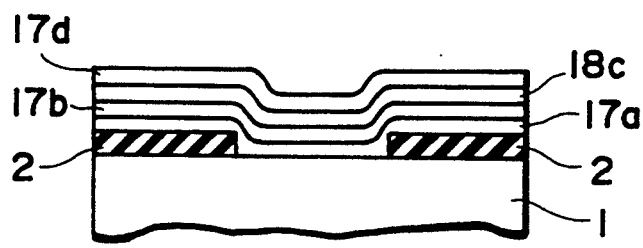
Figure 9:
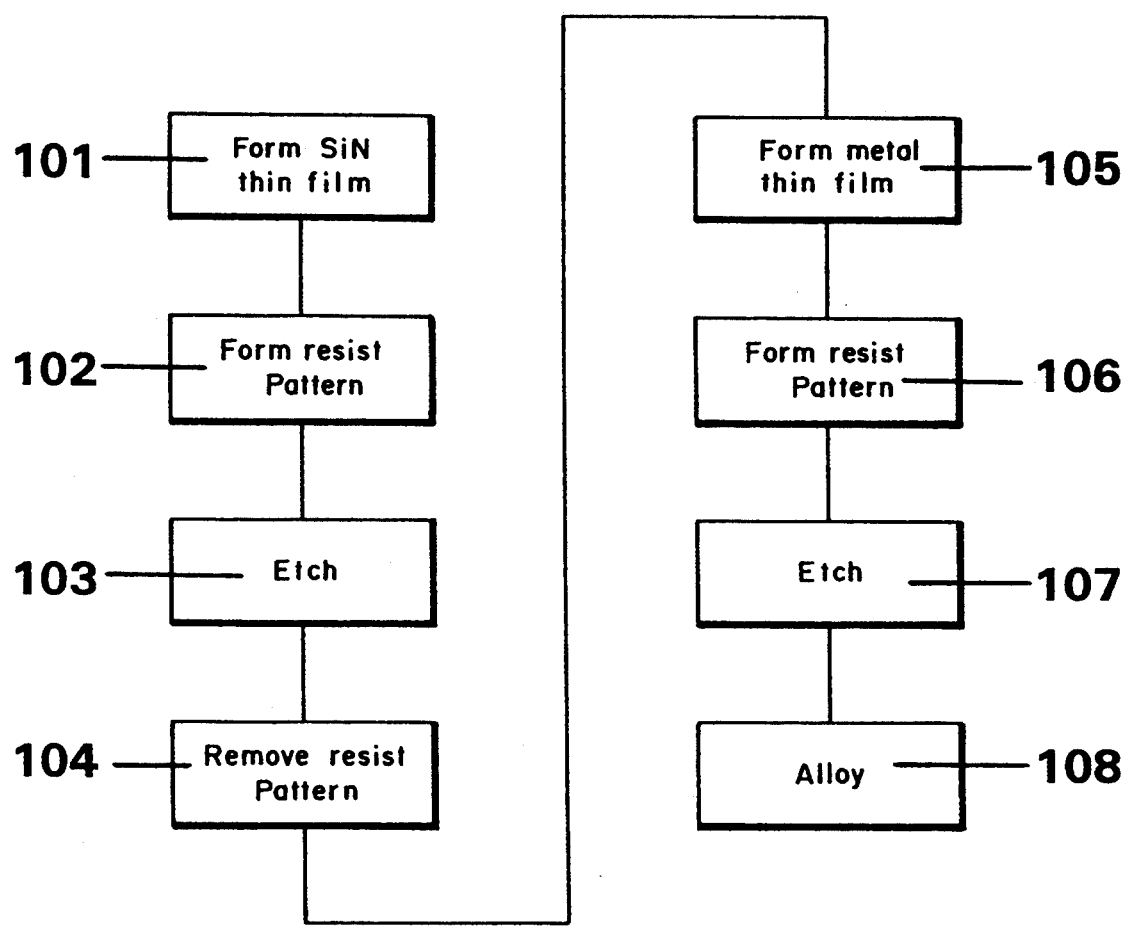
FIG. 9 shows a flow chart of the process therefor.

In the first step, the SiN thin film 2 is formed on the GaAs substrate 1 to a thickness of 1500 Angstrom (step 101 in FIG. 9, and FIG. 8A). In the present embodiment, a plasma CVD device is used to form it. Then, a photoresist material is applied to form the resist pattern 6 having the opening in the ohmic electrode formation area (step 102 in FIG. 9, and FIG. 8B). The SiN layer 2 in the ohmic electrode formation area is etched by a reactive ion etching (RIE) device by using the resist pattern 6 as a mask (step 103 in FIG. 9, and FIG. 8C). In the etching, $CF_4$ is used as plasma etching gas. Then, the resist pattern 6 is removed by using an $O_2$ plasma asher (step 104 in FIG. 9, and FIG. 8D).

In the second step, the AuGe layer 17a having a film thickness of 1000 Angstrom and the Ni layer 17b having a film thickness of 300 Angstrom are sequentially formed by a vacuum deposition method On the SiN thin film 2 and the exposed GaAs substrate 1. Then, the WSi layer 18c having a film thickness of 1000 Angstrom and the Au layer 17d having a film thickness of 1500 Angstrom are sequentially formed by using a sputtering method (step 105 in FIG. 9, and FIG. 8E). The sputtering method is used to form the WSi layer 18c because the sputtering method is most suitable for the formation of a metal such as the WSi layer 18c. The vacuum deposition method is not suitable for the formation of the metal such as the WSi layer 18c because it cannot raise the temperature to the melting point. In the present embodiment, the sputtering method can be used because the unnecessary metal is not removed by the lift-off method as it is done in the prior art. The reason therefor is described below. The lift-off method removes a fragile resist pattern on a step wall to remove the unnecessary metal formed on the resist pattern. However, where the metal is formed by the sputtering method after the formation of the resist pattern, the side of the resist pattern is also covered by the metal. As a result, the removal of the resist pattern by the lift-off method is not possible after the formation of the metal by the sputtering method.

Figure 8F:
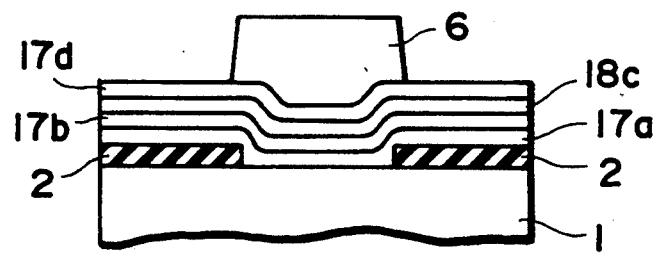
Figure 8G:
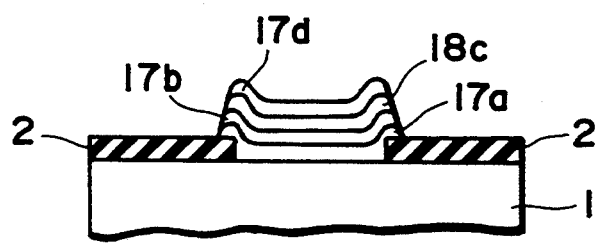
Figure 8H:
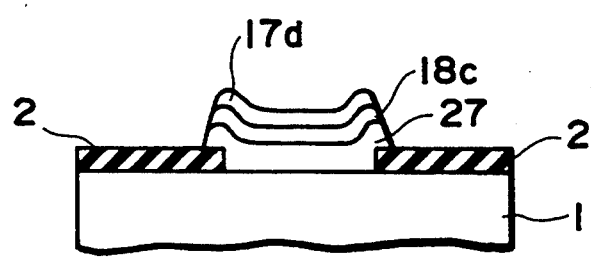

In the third step, the photo-resist is applied to the ohmic electrode formation area on the surface of the Au layer 17d to form the resist pattern 6 (step 106 in FIG. 9, and FIG. 8F). The Au layer 17d, the WSi layer 18c, the Ni layer 17b and the AuGe layer 17a are etched by an ion milling method by inactive Ar+ ions accelerated at 600 volts by using the resist pattern 6 as a mask. Then, the resist pattern 6 is removed by using an $O_2$ plasma asher (step 107 in FIG. 9, and FIG. 8G). Damage to the GaAs substrate 1 by the etching process is prevented by the SiN layer 2 formed on the GaAs substrate 1. There is no risk of the redeposition of the unnecessary metal because the ohmic electrode is formed by etching the metals.

In the fourth step, the structure is heated to 450° C. for 60 seconds to alloy the Ni layer 17b and the AuGe layer 17a. The AuGe/Ni alloy layer 27 is formed by the alloying (step 108 in FIG. 9, and FIG. 8H). When the Au layer 17d is formed directly on the Ni layer 17b and then the Ni layer 17b and the AuGe layer 17a are alloyed, the ball-up frequently occurs, which loses the flatness of the ohmic electrode and deteriorates the reliability. In the present embodiment, the WSi layer 18c is inserted as a barrier between the Ni layer 17b and the Au layer 17d to maintain the flatness of the ohmic electrode.

Figure 10:
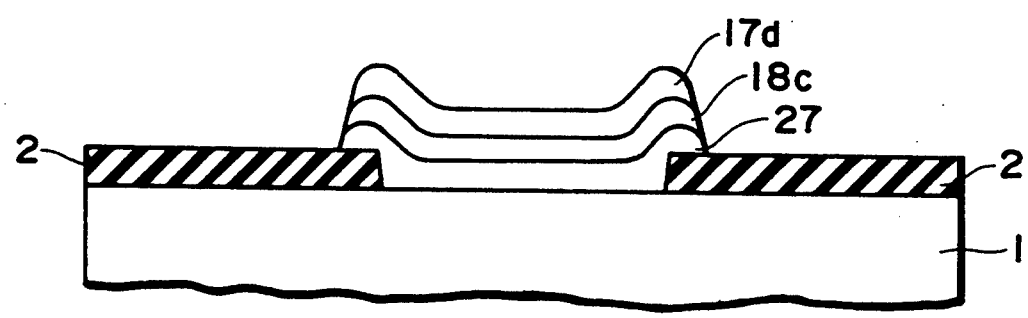
FIG. 10 shows a sectional view of an ohmic electrode structure in an embodiment of the present invention.

FIG. 10 shows a sectional view of the ohmic electrode structure formed by the above method. As shown, the SiN film 2 which is the interlayer insulation film having the opening in the ohmic electrode formation area is formed on the GaAs substrate 1. The ohmic electrode is formed in the opening. The ohmic electrode consists of the AuGe/Ni alloy layer 27, the WSi layer 18c and the Au layer 17d. Since the WSi layer 18c functions as the barrier, the flatness of the ohmic electrode is maintained during the formation of the AuGe/Ni alloy layer 27. The resistance of the ohmic electrode is also reduced by the function of the Au layer 17d.

In the present embodiment, the vacuum deposition method is used to form the AuGe layer 17a and the Ni layer 17b, and the sputtering method is used to form the Au layer 17d, although they are not restrictive. For example, the sputtering method may be used to form the AuGe layer 17a.

In the present embodiment, the SiN film 2 is used as the interlayer insulation film although other insulation films (for example, an $SiO_2$ film) may be used.

In the present embodiment, the WSi layer 18c is used as the barrier metal layer in the alloying process. Alternatively, a TiW layer may be used. A formation method in that case is similar to that described above, but it is briefly explained below.

Figure 11A:
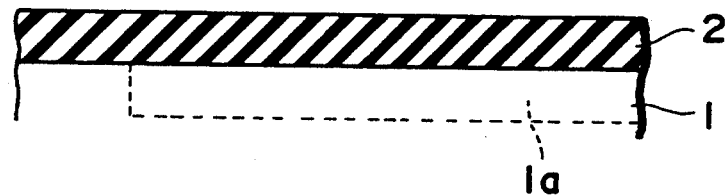
FIGS. 11A to 11F show sectional views of steps of a second method for forming the ohmic electrode in an embodiment of the present invention.
Figure 11B:
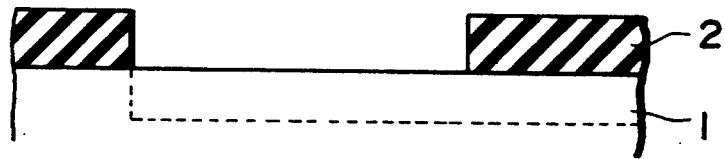

In the step of FIG. 11A, the SiN film 2, which is the insulation film, is formed on the n-type ion implantation region 1a on the surface of the GaAs substrate 1 by using a P-CVD device. In a step of FIG. 11B, the SiN film 2 in the area in which the ohmic electrode structure is to be formed is removed by using the photo-resist and the RIE.

Figure 11C:
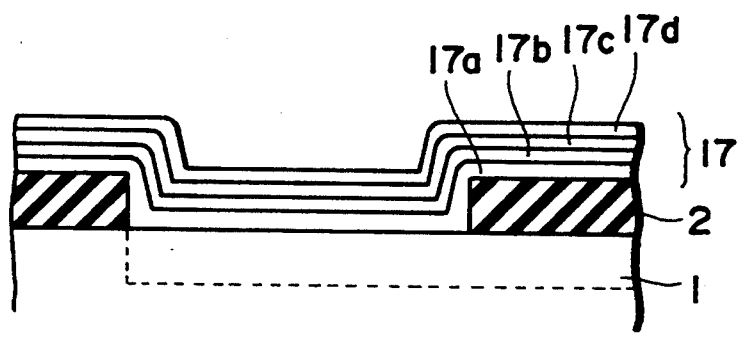

In a step of FIG. 11C, the AuGe/Ni/TiW/Au metal layers 17a–17d are formed. More particularly, the AuGe layer 17a having a thickness of 1000 Angstrom and the Ni layer 17b having a thickness of 300 Angstrom are sequentially formed by using the vacuum deposition device, and the TiW layer 17c of 400 Angstrom and the Au layer 17d of 1500 Angstrom are sequentially formed by using the sputtering device.

Figure 11D:
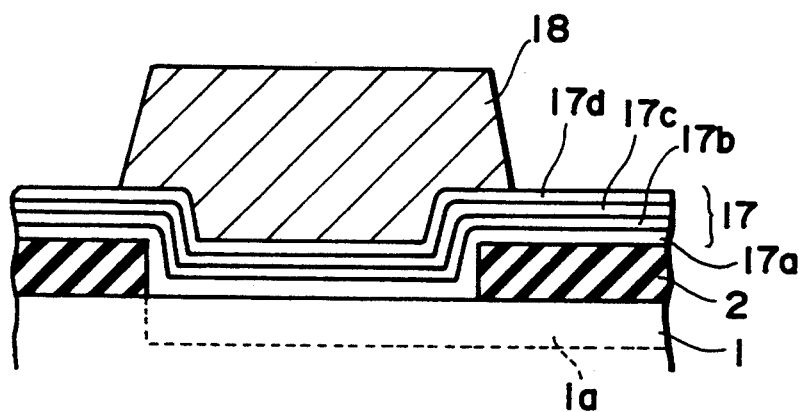

In a step of FIG. 11D, the resist pattern 18 is formed on the AuGe/Ni/TiW/Au metal layers 17a–17d by using the lithography technique, and an area in which the ohmic electrode structure is to be formed is patterned.

Figure 11E:
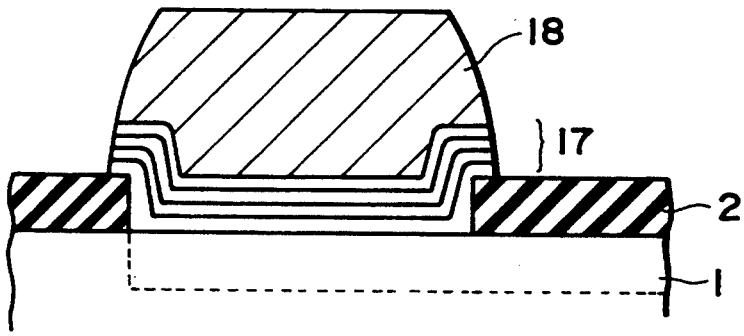

In a step of FIG. 11E, the Au layer 17d, the TiW layer 17c, the Ni layer 17b and the AuGe layer 17a are etched sequentially in the area in which the resist pattern 18 has been removed.

Figure 11F:
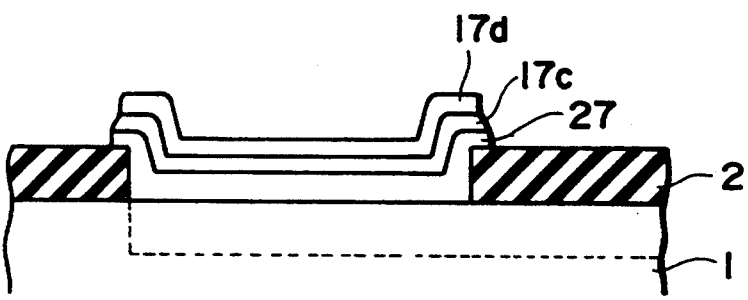

In a step of FIG. 11F, the remainder of the resist pattern 18 is removed, and the AuGe layer 17a, the Ni layer 17b, and the surface of the n-type ion implantation area 1a are alloyed at 450° C. for one minute by using an atmosphere furnace to form the alloy layer 27. Thus, the ohmic contact is formed between the n-type ion implantation area 1a and the alloy layer 27.

In the above method, the TiW layer is used as the barrier metal although other alloys of metals which function similarly may be used.

By the provision of the ohmic electrode structure formed by the above method, the ohmic electrode structure formed in the semiconductor device has a sufficiently low contact resistance, and the resistance of the ohmic electrode area is also sufficiently low. Accordingly, there is no need for increasing the area for the ohmic electrode wiring, the integration density of the semiconductor device can be increased, and the deterioration of the characteristic of each component is prevented.

With the ohmic electrode of the present invention, the flatness of the electrode is maintained by the tungsten (W) alloy layer formed on the AuGe/Ni alloy layer. In addition, the reduction of the resistance of the electrode is attained by the Au layer formed on the tungsten (W) alloy layer. As a result, the ohmic electrode structure of the present invention may be effectively used in a field which requires the high density integration such as a GaAs LSI.

In the method for forming the ohmic electrode structure described above, since the tungsten (W) alloy layer, such as the TiW layer, or the WSi layer functions as the barrier metal for the GaAs/AuGe/Ni alloy layer and the Au layer in the alloying step, the alloying proceeds only in the GaAs/AuGe/Ni alloy layer. Accordingly, the contact resistance of the ohmic contact can be sufficiently reduced. Further, since the Au layer is formed on the TiW layer or the WSi layer, the resistance of the ohmic electrode area can also be sufficiently reduced.

In the method for forming the ohmic contact of the present invention, there is no risk of redeposition of unnecessary metals because the metal layers are etched. As a result, the improvement of yield is expected.

Figure 12:
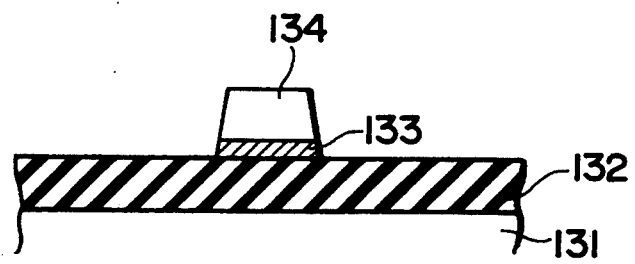
FIG. 12 shows a sectional view of a wiring structure of a semiconductor device in an embodiment of the present invention.

A wiring structure of a compound semiconductor device in accordance with an embodiment of the present invention is now explained with reference to a sectional view of FIG. 12. A TiW (alloy of Ti and W) layer 133 is formed in a predetermined area of an underlying insulation film 132 on a GaAs substrate 131 in which a semiconductor device is formed, and an Au wiring layer 134 is formed thereon to connect devices. A mass percentage of Ti in the TiW is 5–30%.

The coupling of the underlying insulation film 132 and the Au wiring layer 134 is secured by the above wiring structure. The TiW layer 133 does not react with the Au wiring layer 134 up to 400° C. and acts as the barrier metal so that the reduction of the wiring resistance of the Au wiring layer 134 is attained.

FIGS. 13A–13D show the steps of the formation of the above wiring structure.

Figure 13A:
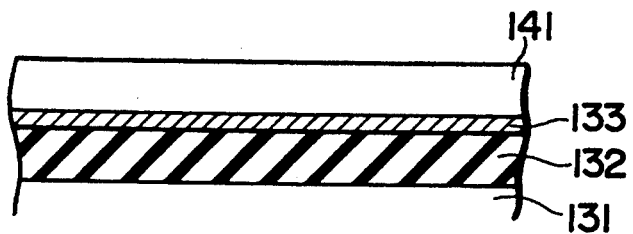
FIGS. 13A-13D show sectional views of steps of a method for forming a wiring structure of the semiconductor device in an embodiment of the present invention.

The TiW layer 133 is formed on the underlying insulation film 132 to a thickness of 500 Angstrom by using the sputtering device. Similarly, the Au layer 141 is formed to a thickness of 5000 Angstrom (FIG. 13A).

Figure 13B:
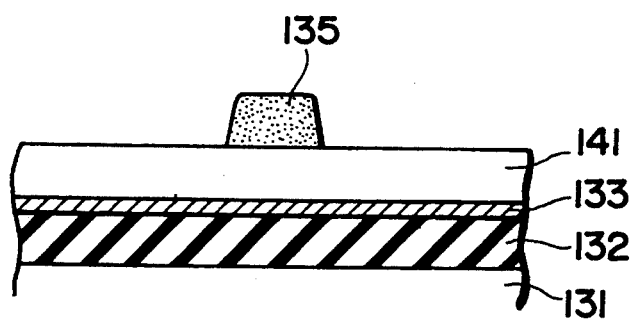

Then, the resist (AZ-1400) is applied onto the Au layer 141 to a thickness of 1.3 μm and a wiring pattern 135 is formed by using the lithography technique (FIG. 13B).

Figure 13C:
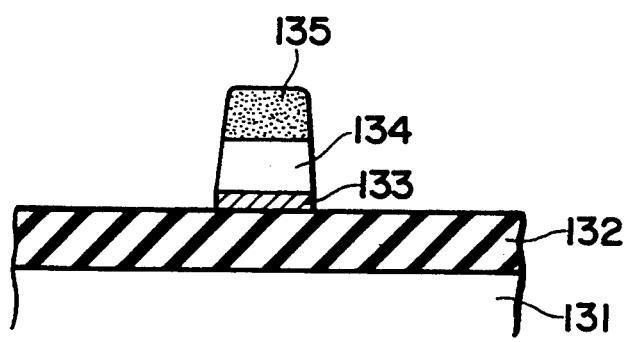

Then, the Au layer 141 and the TiW layer 133 are sequentially etched by Ar gas by using the wiring pattern 135 as a mask and the ion milling device (FIG. 13C).

Figure 13D:
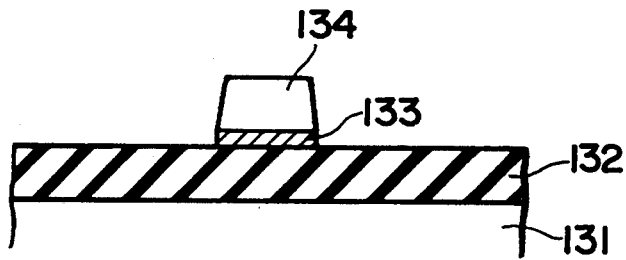

Finally, the wiring pattern 135 is removed (FIG. 13D).

Through the above steps, the Au wiring layer 134 having the TiW layer 133 between it and the underlying insulation film 132 is formed.

When the mass percentage of Ti in the TiW layer 133 is less than 5%, the coupling to the Au wiring layer 134 is poor, and when it is more than 30%, it reacts with the Au wiring layer 134 at a high temperature. Accordingly, in the present invention, the mass percentage of Ti is 5–30%.

In accordance with the wiring structure of the semiconductor device of the present invention, the low resistance of the Au wiring layer can be maintained while the coupling of the underlying insulation film and the Au wiring layer is enhanced. No effect is observed to the wiring resistance even in a high temperature atmosphere of 400° C. When the present invention is used in a multi-layer wiring structure, Au of the first layer wiring and TiW or TiN of the second layer wiring contact so that the semiconductor device having a high reliability is provided.

A resistor and a peripheral wiring thereof in an embodiment of the present invention are now explained.

FIGS. 14A–14D show steps for forming a wiring and a high resistance region on an insulation film.

A NiCrSi layer 212 which is a resistor metal is formed on a surface of an insulation film 211 by sputtering to a thickness of 500 Angstrom. Then, a TiW layer 213 is formed on the surface of the NiCrSi layer 212 by sputtering to a thickness of 500 Angstrom. An Au layer 214 is formed on the surface of the TiW layer 213 by sputtering to a thickness of 2000 Angstrom. In this manner, the three-layered metal layer 215 consisting of the NiCrSi layer 212, the TiW layer 213 and the Au layer 214 is formed.

Figure 14A:
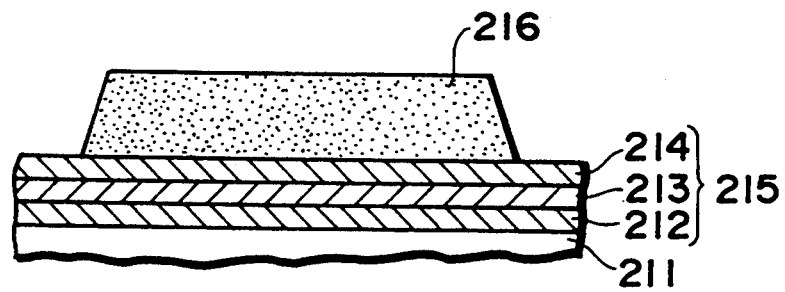
FIGS. 14A-14D show sectional views of steps of a method for manufacturing a resistor and a peripheral wiring thereof in an embodiment of the present invention.
Figure 14B:
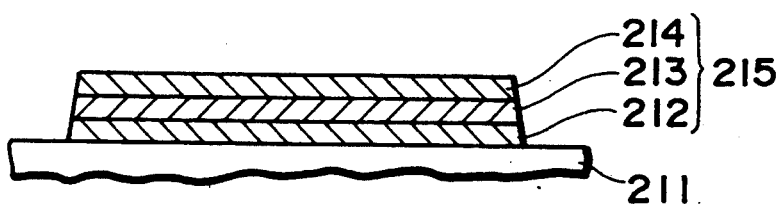

Then, photo resist is applied on the entire surface of the multi-layer metal layer 215 to form a resist film, which is then exposed to form a resist pattern 216 (FIG. 14A). The resist pattern 216 is used to remove the multi-layer metal layer 215 in the area other than the wiring area and the high resistance area.

The multi-layer metal layer 215 is etched by the ion milling method by using the resist pattern 216 formed on the multi-layer metal layer 215 as a mask. In this manner, the multi-layer metal layer 215 in the area other than the wiring area and the high resistance area is removed.

Figure 14C:
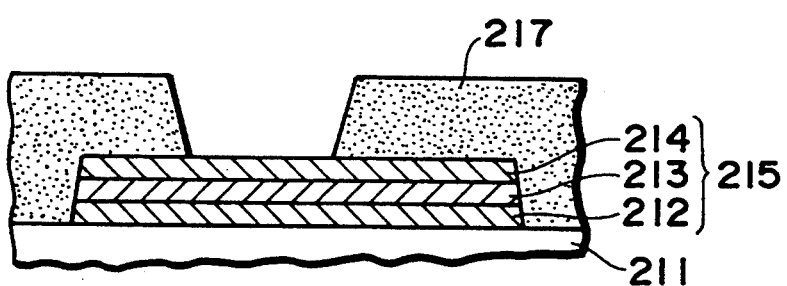
Figure 14D:
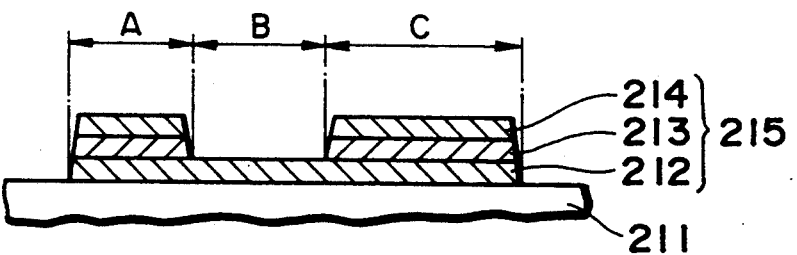

Then, photo-resist is applied onto the remaining multi-layer metal layer 215 to form the resist film. The resist film is exposed to form an opening in the high resistance formation area to form a resist pattern 217 (FIG. 14C).

The Au layer 214 is selectively etched by the ion milling method by using the resist pattern 217 as a mask. Since an etching rate of the Au layer 214 is four times as large as that of the underlying TiW layer 213, only the Au layer 214 can be removed by time control. Further, the TiW layer 213 is etched by the reactive ion etching (RIE) method by using $SF_6$ gas. In the etching using the $SF_6$ gas, the NiCrSi layer 212 under the TiW layer 213 is not removed. Accordingly, only the TiW layer 213 can be selectively removed. After the etching of the Au layer 214 and the TiW layer 213, the resist pattern 217 is removed.

The area of the NiCrSi layer 212 exposed by the etching functions as the high resistance area. The three-layer metal layer 215 not removed by the etching functions as the wiring. Since the high resistance area and the wiring are connected by the NiCrSi layer 212, they are positively electrically connected. Accordingly, a defective product due to bad connection is prevented and the yield is improved.

In the present embodiment, the NiCrSi layer 212 is used as the resistor metal layer and the TiW layer 213 and the Au layer 214 are used as the wiring metal layer although they are not restrictive. For example, an oxidized NiCr layer may be used in place of the NiCrSi layer 212. A TiN layer may be used in place of the TiW layer 213. An Al layer may be used in place of the Au layer 214. The wiring metal layer may be a single-layer metal layer.

In accordance with the method for forming the resistor and the peripheral wiring thereof of the present invention, a step to form a contact hole is not necessary because the high resistance area and the wiring are formed in one layer. Accordingly, the manufacturing process is simplified. Further, since the positioning due to the formation of the contact hole is not necessary, a high density integration is attained. Further, since the high resistance area is formed by the high precision etching process, the resistance of the high resistance area is stable.

What is claimed is:

1. A method for manufacturing a resistor element, comprising the steps of:
    forming a resistive layer made of a material having high resistance on an insulating layer;
    sequentially forming a conductive layer including a TiW layer and an Au layer on said resistive layer;
    removing an undesired area of said conductive layer and said resistive layer by using a lithography technique to form a wiring portion; and etching a desired area of said conductive layer from the wiring portion to form a resistor element portion between two wiring portions.

2. A method for manufacturing a resistor element according to claim 1, wherein said two wiring portions are each a laminated structure of a TiW layer and an Au layer.

3. A method for forming an ohmic electrode, comprising the steps of:
    forming a gold-germanium layer on a GaAs substrate;
    forming a nickel layer directly on said gold-germanium layer;
    forming a tungsten alloy layer directly on said nickel layer;
    forming a gold layer directly on said tungsten alloy layer;
    forming a mask pattern on said gold layer to cover an ohmic electrode formation area;
    removing said gold-germanium layer, said nickel layer, said tungsten alloy layer and said gold layer in an area not covered by said mask pattern;
    thereafter removing said mask pattern from said gold layer;
    forming a gold-germanium/nickel alloy layer by heating said gold-germanium layer, said nickel layer, said tungsten alloy layer and said gold layer under the condition that alloy reaction is caused only among said gold-germanium layer, said nickel layer and said GaAs substrate.

4. The method according to claim 3, wherein said gold-germanium layer has a thickness between 800 and 1200 Angstroms, said nickel layer has a thickness between 200 and 400 Angstroms, said tungsten alloy layer has a thickness between 200 and 1000 Angstroms, and said gold layer has a thickness between 1000 and 3000 Angstroms.

5. A method for forming an ohmic electrode according to claim 3 wherein said tungsten (W) alloy layer is a titanium tungsten (TiW) layer.

6. A method for forming an ohmic electrode according to claim 3 wherein said tungsten (W) alloy layer is a tungsten silicide (WSi) layer.

7. A method for forming an ohmic electrode comprising the steps of:
    forming an interlayer insulation film on a GaAs substrate;
    selectively removing a portion of said interlayer insulation film to expose the GaAs substrate in an ohmic electrode formation area;
    forming a gold-germanium layer on the GaAs substrate in said ohmic electrode formation area;
    forming a nickel layer directly on said gold-germanium layer;
    forming a tungsten alloy layer directly on said nickel layer;
    forming a gold layer directly on said tungsten alloy layer;
    forming a mask pattern on said gold layer to cover said ohmic electrode formation area;
    removing said gold-germanium layer, said nickel layer, said tungsten alloy layer and said gold layer in an area not covered by said mask pattern;
    thereafter removing said mask pattern from said gold layer;
    heating said gold-germanium layer, said nickel layer, said tungsten alloy layer and said gold layer to cause alloying to proceed only among said gold-germanium layer, said nickel layer and said GaAs substrate.

8. The method according to claim 7, wherein said gold-germanium layer has a thickness between 800 and 1200 Angstroms, said nickel layer has a thickness between 200 and 400 Angstroms, said tungsten alloy layer has a thickness between 200 and 1000 Angstroms, and said gold layer has a thickness between 1000 and 3000 Angstroms.

9. A method for forming an ohmic electrode according to claim 7 wherein said tungsten (W) alloy layer is a titanium tungsten (TiW) layer.

10. A method for forming an ohmic electrode according to claim 7 wherein said tungsten (W) alloy layer is a tungsten silicide (WSi) layer.

* * * * *